(12) United States Patent
Lien et al.

(10) Patent No.: US 7,443,747 B2
(45) Date of Patent: Oct. 28, 2008

(54) MEMORY ARRAY BIT LINE COUPLING CAPACITOR CANCELLATION

(75) Inventors: Chuen-Der Lien, Los Altos Hills, CA (US); Tzong-Kwang Henry Yeh, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 128 days.

(21) Appl. No.: 10/997,708

(22) Filed: Nov. 23, 2004

(65) Prior Publication Data

US 2006/0028860 A1 Feb. 9, 2006

Related U.S. Application Data

(60) Provisional application No. 60/600,351, filed on Aug. 9, 2004.

(51) Int. Cl.
*G11C 7/00* (2006.01)
(52) U.S. Cl. ...................................... 365/203; 365/154
(58) Field of Classification Search .................. 365/203, 365/154, 149
See application file for complete search history.

(56) References Cited

U.S. PATENT DOCUMENTS

| 4,809,052 | A  | * | 2/1989 | Nishioka et al. ............. 365/154 |
| 6,370,078 | B1 | * | 4/2002 | Wik et al. .............. 365/230.05 |
| 6,785,176 | B2 | * | 8/2004 | Demone ...................... 365/202 |

* cited by examiner

*Primary Examiner*—Michael T Tran
(74) *Attorney, Agent, or Firm*—Bever, Hoffman & Harms LLP

(57) ABSTRACT

Capacitive coupling correction circuits are coupled between adjacent parallel dynamic (pre-charged) or static conductors. The capacitive coupling correction circuits effectively isolate a low voltage applied to a first conductor from a high pre-charged voltage stored on an adjacent second conductor (or vice versa). The adjacent parallel conductors can be bit lines of a memory cell. Each capacitive coupling correction circuit can include an inverter having an input terminal coupled to the first conductor, and an output terminal coupled to a first plate of a capacitor. A second plate of the capacitor is coupled to the second conductor. The capacitance of the capacitor is selected to be identical to a parasitic capacitance between the first and second conductors. As a result, there is a zero net voltage effect between the first and second conductors. The capacitive coupling correction circuits may be distributed along the length of the first and second conductors.

13 Claims, 4 Drawing Sheets

MEMORY ARRAY BIT LINE COUPLING CAPACITOR CANCELLATION

RELATED APPLICATION

The present application is related to and claims priority of U.S. Provisional Patent Application Ser. No. 60/600,351 filed by Chuen-Der Lien and Tzong-Kwang Henry Yeh on Aug. 9, 2004.

FIELD OF THE INVENTION

The present invention relates to systems that implement parallel dynamic (pre-charged) nodes and parallel static nodes.

RELATED ART

FIG. 1 is a circuit diagram of a column 100 of a conventional dual-port static random access memory (SRAM) array. SRAM column 100 includes dual-port SRAM memory cells $101_0$–$101_N$, p-channel pre-charge transistors 121–122 and 131–132, pre-charge enable lines $PREC_A$ and $PREC_B$, word lines $WL_{A0}$–$WL_{AN}$ and $WL_{B0}$–$WL_{BN}$ and bit lines $BL_A$–$BL_{A\#}$ and $BL_B$–$BL_{B\#}$. Bit lines $BL_A$–$BL_{A\#}$ are coupled to a first port ($PORT_A$) of each memory cell of column 100, and bit lines $BL_B$–$BL_{B\#}$ are coupled to a second port ($PORT_B$) of each memory cell in column 100.

Dual-port SRAM cell $101_0$ includes p-channel pull-up transistors 111–112, n-channel pull-down transistors 113–114, first port access transistors 115–116, and second port access transistors 117–118. Transistors 111–114 are configured to form a latch circuit, which is used to store a data value. The other SRAM cells in column 100, including SRAM cell $101_N$, are identical to SRAM cell $101_0$.

Each of the bit lines $BL_A$–$BL_{A\#}$ and $BL_B$–$BL_{B\#}$ exhibits a parasitic capacitance to ground, and a parasitic capacitance between adjacent bit lines. The parasitic capacitance $C_{AB}$ between adjacent bit lines $BL_A$ and $BL_B$ is illustrated as capacitive element 140. The parasitic capacitance $C_A$ between bit line $BL_A$ and ground is illustrated as capacitive element 141. The parasitic capacitance $C_B$ between bit line $BL_B$ and ground is illustrated as capacitive element 142.

The parasitic capacitances $C_A$, $C_B$ and $C_{AB}$ can result in erroneous read operations in certain conditions. For example, assume that SRAM cell $101_0$ stores a logic "1" value, such that a logic high voltage is stored on node N1, and a logic low voltage is stored on node N0. To perform a read operation on the second port ($PORT_B$), the $PREC_B$ signal is activated low, thereby turning on pre-charge transistors 131–132, and pre-charging bit lines $BL_B$–$BL_{B\#}$ to the $V_{DD}$ supply voltage. After bit lines have been pre-charged to the $V_{DD}$ supply voltage, the $PREC_B$ signal is deactivated high, thereby turning off pre-charge transistors 131–132. The word line signal on word line $WL_{B0}$ is then activated high for a period of time, thereby turning on n-channel access transistors 117 and 118. At this time, the logic high voltage on node N1 tends to maintain the $V_{DD}$ voltage on bit line $BL_B$, and the logic low voltage on node N0 tends to pull down the voltage on bit line $BL_{B\#}$. For example, the voltage on bit line $BL_B$ may be equal to a full $V_{DD}$ supply voltage of 1.8 Volts, while the voltage on bit line $BL_{B\#}$ may be pulled down to 1.7 Volts. A sense amplifier (not shown) detects the small voltage difference across bit lines $BL_B$ and $BL_{B\#}$ to determine the state of the data value stored by SRAM cell $101_0$.

A write operation can be performed on the first port of SRAM cell $101_N$ at the same time that the above-described read operation is performed on the second port of SRAM cell $101_0$. For example, to write a logic "0" value to the first port ($PORT_A$) of SRAM cell $101_N$, the $PREC_A$ signal is activated low, thereby turning on pre-charge transistors 121–122, and pre-charging bit lines $BL_A$–$BL_{A\#}$ to the $V_{DD}$ supply voltage. After the bit lines $BL_A$–$BL_{A\#}$ have been pre-charged to the $V_{DD}$ supply voltage, the $PREC_A$ signal is deactivated high, thereby turning off pre-charge transistors 121–122. The signal on word line $WL_{AN}$ is then activated high for a period of time, thereby turning on the n-channel access transistors associated with the first port of SRAM cell $101_N$. The logic "0" data value is applied to bit lines $BL_A$–$BL_{A\#}$, such that the $V_{DD}$ supply voltage is applied to bit line $BL_{A\#}$, and the $V_{SS}$ ground supply voltage (0 Volts) is applied to bit line $BL_A$.

As described above, the parasitic capacitance $C_{AB}$ electrically couples adjacent bit lines $BL_A$ and $BL_B$. That is, the parasitic capacitance $C_{AB}$ electrically couples the voltage drop on bit line $BL_A$ (i.e., from 1.8 Volts to 0 Volts) to bit line $BL_B$. As a result, the voltage on bit line $BL_B$ is undesirably reduced. In some instances, the voltage on bit line $BL_B$ is reduced low enough to cause an erroneous data value to be detected on bit lines $BL_B$–$BL_{B\#}$. More specifically, the voltage on bit line $BL_B$ can be reduced from the desired value of 1.8 Volts to a voltage that is lower than the voltage on bit line $BL_{B\#}$. For example, the voltage on bit line $BL_B$ can be reduced to 1.6 Volts, while the voltage on bit line $BL_{B\#}$ remains at 1.7 Volts. In this case, a logic "0" value is erroneously read from the second port of memory cell $101_0$ on bit lines $BL_B$–$BL_{B\#}$.

The above-described problem has been solved in various ways in the past. In one conventional memory, a metal line is routed down the center of the SRAM column 100, at the location generally indicated by dashed region 150. A static voltage, such as $V_{DD}$ or ground, is coupled to the metal line. As a result, the parasitic capacitance $C_{AB}$ between adjacent bit lines $BL_A$ and $BL_B$ is minimized. However, the formation of a metal line for each column of the memory array disadvantageously requires a relatively large layout area.

In another conventional memory, bit line $BL_A$ is twisted with bit line $BL_{A\#}$, and the bit line $BL_B$ is twisted with bit line $BL_{B\#}$. FIG. 2 illustrates an SRAM column 200 having twisted bit lines. Similar elements in FIGS. 1 and 2 are labeled with similar reference numbers. The bit lines $BL_A$–$BL_{A\#}$ and $BL_B$–$BL_{B\#}$ are twisted at their midpoints, as illustrated by the dashed lines. As a result, the parasitic capacitance $C'_{AB}$ between bit lines $BL_A$ and $BL_B$ is reduced (based on the increased spacing between bit lines $BL_A$ and $BL_B$ in the upper half of the SRAM column 200. The reduced parasitic capacitance $C'_{AB}$ results in a reduced electrical coupling between bit lines $BL_A$ and $BL_B$. However, electrical coupling still exists between bit lines $BL_A$ and $BL_B$, which can result in the erroneous read conditions described above. In addition, the bit line twisting requires additional layout area compared to a non-twisted bit line arrangement.

It would therefore be desirable to have an improved data transmission structure that enables adjacent dynamic (pre-charged) conductive elements to properly transmit data signals in spite of the parasitic capacitive coupling inherent between these conductive elements. It would further be desirable if such a structure could be implemented without significantly increasing the layout area of a conventional data transmission structure.

SUMMARY

Accordingly, the present invention provides capacitive coupling correction circuits, which are coupled between adjacent parallel dynamic (pre-charged) or static conductors. The capacitive coupling correction circuits effectively isolate a low voltage applied to a first conductor from a high precharged voltage stored on an adjacent second conductor (or vice versa). The adjacent parallel conductors can be, for example, bit lines of a memory cell. In a particular embodiment, each capacitive coupling correction circuit can include an inverter having an input terminal coupled to a first conductor, and an output terminal coupled to a first plate of a capacitor. A second plate of the capacitor is coupled to a second conductor. The capacitance of the capacitor is selected to be identical to a parasitic capacitance between the first and second conductors. As a result, there is a zero net voltage effect between the first and second conductors. In another embodiment, the capacitive coupling correction circuits are distributed along the length of the first and second conductors.

The present invention will be more fully understood in view of the following description and drawings.

DETAILED DESCRIPTION

Figure 1:
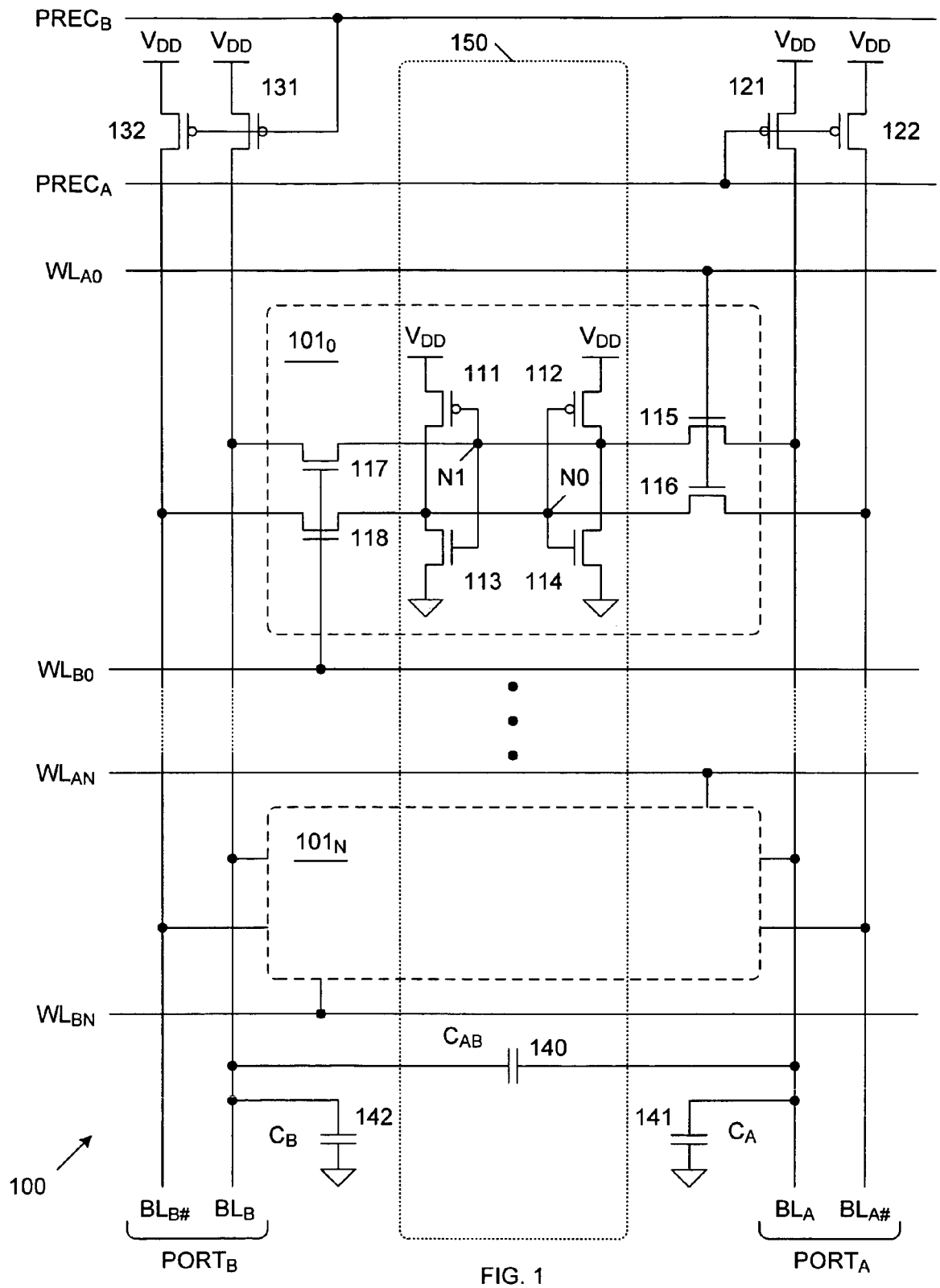
FIG. 1 is a circuit diagram of a conventional column of multi-port SRAM memory cells.
Figure 3:
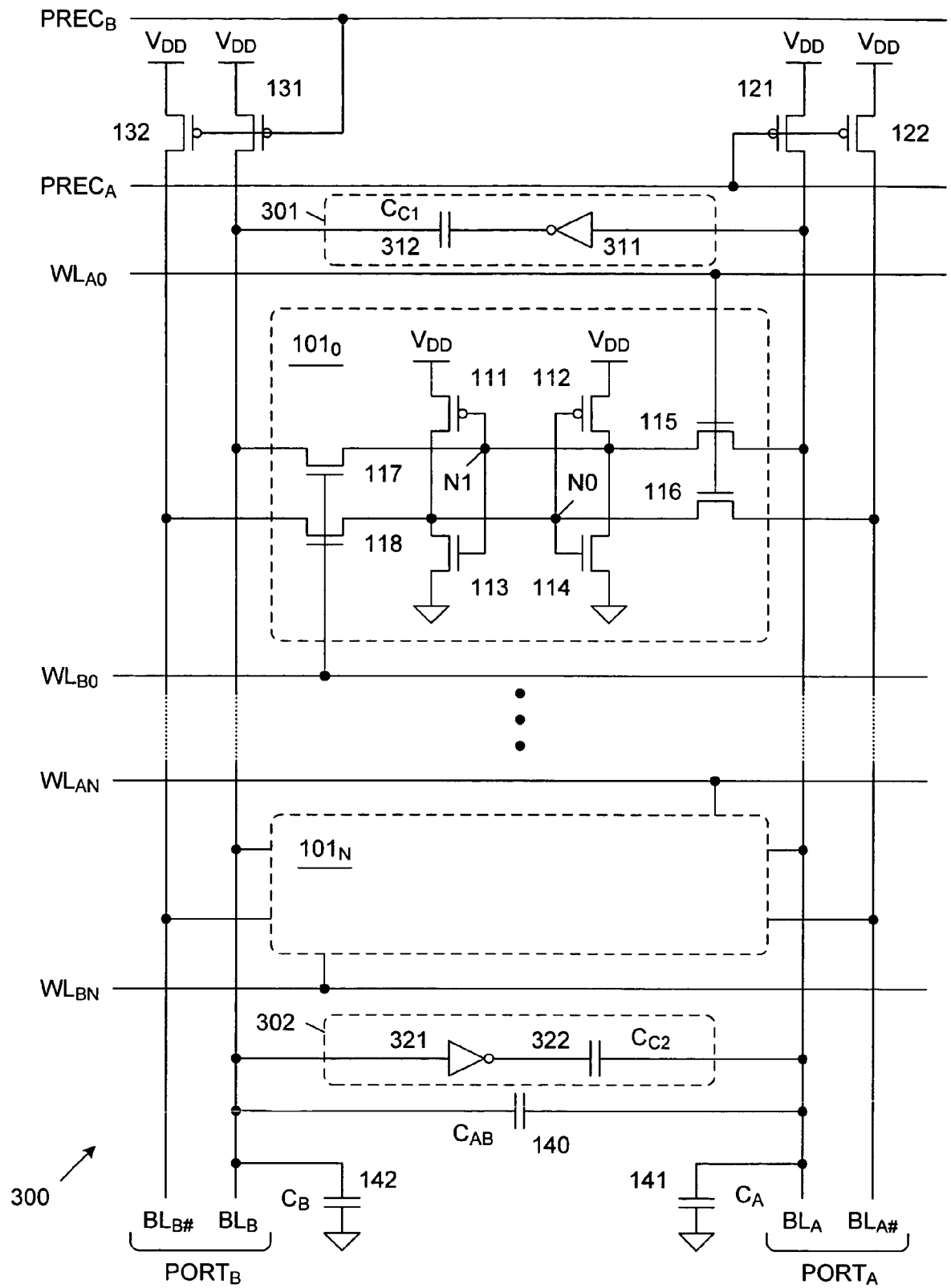
FIG. 3 is a circuit diagram of a column of multi-port SRAM memory cells in accordance with one embodiment of the present invention.

FIG. 3 is a circuit diagram of a column 300 of multi-port SRAM memory cells in accordance with one embodiment of the present invention. It is understood that any number of SRAM columns, identical to SRAM column 300, can be combined to form a memory array. Similar elements in FIGS. 1 and 3 are labeled with similar reference numbers. Thus, SRAM column 300 includes dual-port SRAM memory cells $101_0$–$101_N$, p-channel pre-charge transistors 121–122 and 131–132, pre-charge lines $PREC_A$ and $PREC_B$, word lines $WL_{A0}$–$WL_{AN}$ and $WL_{B0}$–$WL_{BN}$, bit lines $BL_A$–$BL_{A\#}$ and $BL_B$–$BL_{B\#}$, and parasitic capacitance elements 140-142, which have been described above in connection with FIG. 1.

In addition, SRAM column 300 includes capacitive coupling correction circuits 301 and 302. Capacitive coupling correction circuit 301 includes inverter 311 and capacitor 312. Inverter 311 has an input terminal coupled to bit line $BL_A$ and an output terminal coupled to capacitor 312. Capacitor 312 is further coupled to bit line $BL_B$. Capacitor 312 is selected to have a capacitance $C_{C1}$, which is matched to the parasitic capacitance $C_{AB}$. In a particular embodiment, capacitive element 140 exhibits a parasitic capacitance $C_{AB}$ on the order of about 10 femto-Farads.

Similarly, capacitive coupling correction circuit 302 includes inverter 321 and capacitor 322. Inverter 321 has an input terminal coupled to bit line $BL_B$ and an output terminal coupled to capacitor 322. Capacitor 322 is further coupled to bit line $BL_A$. Capacitor 322 is selected to have a capacitance $C_{C2}$, which is also matched to the parasitic capacitance $C_{AB}$. Each of inverters 311 and 321 provides an output signal that swings between the $V_{DD}$ voltage supply and ground.

Capacitor coupling correction circuit 301 operates as follows. To write a logic "0" value to memory cell $101_N$ on the first port ($PORT_A$), bit lines $BL_A$ and $BL_{A\#}$ are pre-charged to the $V_{DD}$ supply voltage (by enabling transistors 121–122), word line $WL_{AN}$ is activated, a logic low voltage is applied to bit line $BL_A$ and a logic high voltage is applied to bit line $BL_{A\#}$. As a result, a logic "0" value is stored in SRAM cell $101_N$.

As described above in connection with FIG. 1, the logic low voltage applied to bit line $BL_A$ is electrically coupled to bit line $BL_B$ by parasitic capacitance 140, thereby tending to pull down the voltage on bit line $BL_B$. However, the logic low voltage on bit line $BL_A$ is applied to the input terminal of inverter 311. In response, inverter 311 provides a logic high output signal to capacitor 312. The logic high voltage applied to capacitor 312 tends to pull up the voltage on bit line $BL_B$. Because the capacitance $C_{C1}$ of capacitor 312 is matched to the parasitic capacitance $C_{AB}$ of capacitive element 140, the voltage on bit line $BL_B$ is unaffected by the logic low voltage on bit line $BL_A$. That is, the amount of charge drawn off of bit line $BL_B$ as a result of the parasitic capacitance $C_{AB}$ of capacitive element 140 is equal to the amount of charge supplied to bit line $BL_B$ as a result of the capacitance $C_{C1}$ of capacitor 312.

Capacitive coupling correction circuit 302 operates in the same manner as correction circuit 301, thereby preventing a low voltage on bit line $BL_B$ from affecting the voltage on bit line $BL_A$.

Figure 2:
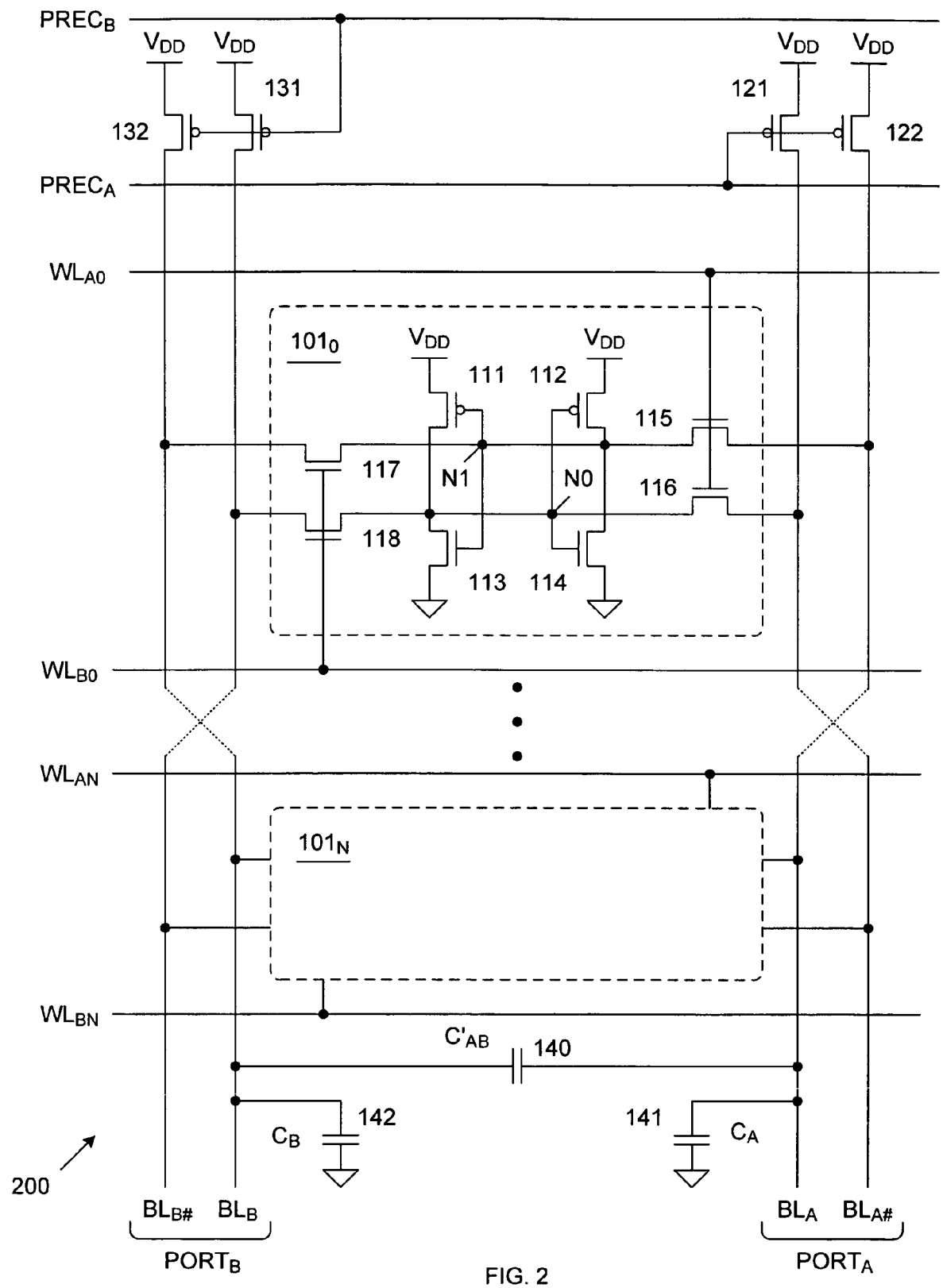
FIG. 2 is a circuit diagram of a conventional column of multi-port SRAM memory cells that implements twisted bit lines.

Capacitive coupling correction circuits 301 and 302 advantageously allow SRAM column 300 to have a smaller size when compared with conventional the conventional SRAM columns of FIGS. 1 and 2.

Figure 4:
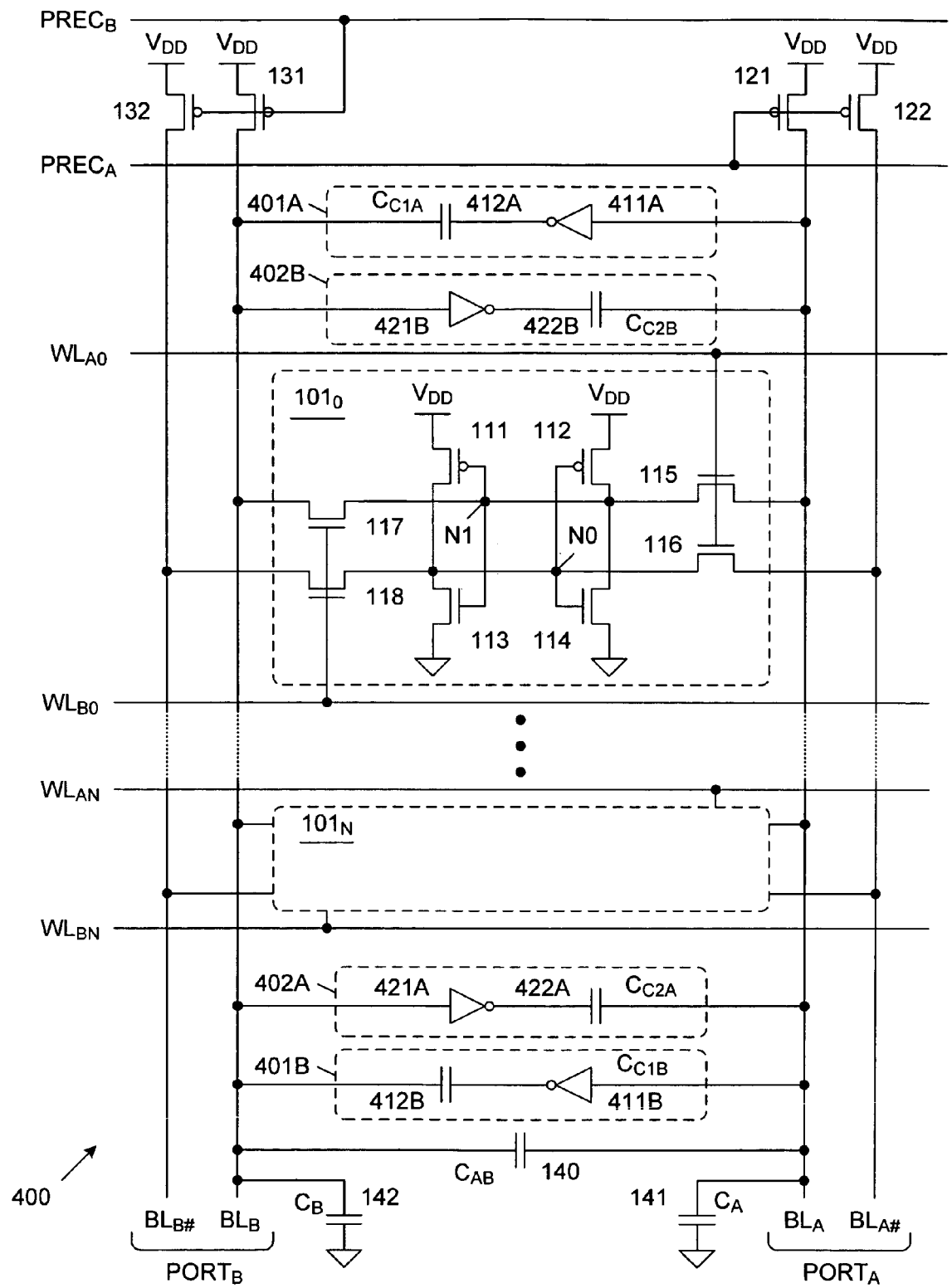
FIG. 4 is a circuit diagram of a column of multi-port SRAM memory cells in accordance with another embodiment of the present invention.

FIG. 4 is a circuit diagram of an SRAM column 400 in accordance with another embodiment of the present invention. Similar elements in FIGS. 3 and 4 are labeled with similar reference numbers. In the present embodiment, capacitive coupling correction circuit 301 is effectively split into a pair of capacitive coupling correction circuits 401A and 401B, which are located at the top and bottom, respectively, of the SRAM column 400. Similarly, capacitive coupling correction circuit 302 is effectively split into a pair of capacitive coupling correction circuits 402A and 402B, which are located at the top and bottom, respectively, of the SRAM column 400.

Capacitive coupling correction circuit 401A includes inverter 411A and capacitor 412A, which are coupled between bit lines $BL_A$ and $BL_B$ in the same manner as inverter 311 and capacitor 312 in FIG. 3. Similarly, capacitive coupling correction circuit 401B includes inverter 411B and capacitor 412B, which are also coupled between bit lines $BL_A$ and $BL_B$ in the same manner as inverter 311 and capacitor 312 in FIG. 3. Capacitors 412A and 412B exhibit capacitances $C_{C1A}$ and $C_{C1B}$, respectively. Each of these capacitances $C_{C1A}$ and $C_{C1B}$ is selected to be equal to one half of the parasitic capacitance $C_{AB}$ between bit lines $BL_A$ and $BL_B$. Collectively, capacitive coupling correction circuits 401A and 401B operate in the same manner as capacitive coupling correction circuit 301 (FIG. 3).

Capacitive coupling correction circuit 402A includes inverter 421A and capacitor 422A, which are coupled between bit lines $BL_A$ and $BL_B$ in the same manner as inverter 321 and capacitor 322 in FIG. 3. Similarly, capacitive coupling correction circuit 402B includes inverter 421B and capacitor 422B, which are also coupled between bit lines $BL_A$ and $BL_B$ in the same manner as inverter 321 and capacitor 322 in FIG. 3. Capacitors 422A and 422B exhibit capacitances $C_{C2A}$ and $C_{C2B}$, respectively. Each of these capacitances $C_{C2A}$ and $C_{C2B}$ is selected to be equal to one half of the parasitic capacitance $C_{AB}$ between bit lines $BL_A$ and $BL_B$. Collectively, capacitive coupling correction circuits 402A and 402B operate in the same manner as capacitive coupling correction circuit 302 (FIG. 3).

Capacitive coupling correction circuits 401A–401B and 402A–402B advantageously distribute the capacitive coupling correction function over the full length of the bit lines $BL_A$ and $BL_B$. In other embodiments, other numbers of capacitive coupling circuits can be distributed along the length of the bit lines $BL_A$ and $BL_B$.

Although the present invention has been described in connection with a dual-port memory cell, it is understood that the present invention can be applied to single port memory cells or multi-port memory cells having more than two ports. Moreover, the present invention can be applied to any system that implements parallel line dynamic (pre-charged) or static nodes.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A circuit comprising:
   a first conductor;
   a second conductor located adjacent to the first conductor, wherein the second conductor extends in parallel with the first conductor, and wherein a parasitic capacitance exists between the first and second conductors;
   a first capacitor coupling correction circuit coupled between the first and second conductors, wherein the first capacitor coupling correction circuit includes a first capacitor having a first capacitance selected to be approximately equal to the parasitic capacitance, wherein the first capacitor coupling correction circuit further comprises a first inverter having an input terminal coupled to the first conductor, wherein the first capacitor is coupled between an output terminal of the first inverter and the second conductor.

2. A circuit comprising:
   a first conductor, wherein the first conductor is a first bit line coupled to a column of memory cells;
   a second conductor located adjacent to the first conductor, wherein the second conductor is a second bit line coupled to the column of memory cells,
   wherein the second conductor extends in parallel with the first conductor, without crossing the first conductor, and wherein a parasitic capacitance exists between the first and second conductors; and
   a first capacitor coupling correction circuit coupled between the first and second conductors, wherein the first capacitor coupling correction circuit includes a first capacitor having a first capacitance selected to be approximately equal to the parasitic capacitance.

3. The circuit of claim 2, wherein the first bit line is coupled to a first port of each memory cell in the column of memory cells, and the second bit line is coupled to a second port of each memory cell in the column of memory cells.

4. The circuit of claim 3, further comprising:
   a third conductor adjacent to the first conductor, and extending in parallel with the first conductor, wherein the third conductor is coupled to the first port of each memory cell in the column of memory cells; and
   a fourth conductor adjacent to the second conductor, and extending in parallel with the second conductor, wherein the fourth conductor is coupled to the second port of each memory cell in the column of memory cells.

5. A circuit comprising:
   a first conductor;
   a second conductor located adjacent to the first conductor, wherein the second conductor extends in parallel with the first conductor, without crossing the first conductor, and wherein a parasitic capacitance exists between the first and second conductors;
   a first capacitor coupling correction circuit coupled between the first and second conductors, wherein the first capacitor coupling correction circuit includes a first capacitor having a first capacitance selected to be approximately equal to the parasitic capacitance; and
   a second capacitor coupling correction circuit coupled between the first and second conductors, wherein the second capacitor coupling correction circuit includes a second capacitor having a second capacitance selected to be approximately equal to the parasitic capacitance.

6. A circuit comprising:
   a first conductor;
   a second conductor located adjacent to the first conductor, wherein the second conductor extends in parallel with the first conductor, and wherein a parasitic capacitance exists between the first and second conductors;
   a first capacitor coupling correction circuit coupled between the first and second conductors, wherein the first capacitor coupling correction circuit includes a first capacitor having a first capacitance selected to be approximately equal to the parasitic capacitance, wherein the first capacitor coupling correction circuit further comprises a first inverter having an input terminal coupled to the first conductor, wherein the first capacitor is coupled between an output terminal of the first inverter and the second conductor, and
   a second capacitor coupling correction circuit coupled between the first and second conductors, wherein the second capacitor coupling correction circuit includes a second capacitor having a second capacitance selected to be approximately equal to the parasitic capacitance, wherein the second capacitor coupling correction circuit further comprises a second inverter having an input terminal coupled to the second conductor, wherein the second capacitor is coupled between an output terminal of the second inverter and the first conductor.

7. A circuit comprising:
   a first conductor;
   a second conductor located adjacent to the first conductor, wherein the second conductor extends in parallel with the first conductor, and wherein a parasitic capacitance exists between the first and second conductors;
   a plurality N of first capacitor coupling correction circuits coupled between the first and second conductors, wherein each of the first capacitor coupling correction circuits includes a capacitor having a capacitance selected to be approximately equal to 1/N of the parasitic capacitance.

8. The circuit of claim 7, wherein each of the first capacitor coupling correction circuits comprises:
   a first inverter having an input terminal coupled to the first conductor; and
   the capacitor coupled between an output terminal of the first inverter and the second conductor.

9. The circuit of claim 7, wherein the first conductor is a first bit line coupled to a column of memory cells, and the second conductor is a second bit line coupled to the column of memory cells.

10. The circuit of claim 9, wherein the first bit line is coupled to a first port of each memory cell in the column of memory cells, and the second bit line is coupled to a second port of each memory cell in the column of memory cells.

11. The circuit of claim 10, further comprising:
a third conductor adjacent to the first conductor, and extending in parallel with the first conductor, wherein the third conductor is coupled to the first port of each memory cell in the column of memory cells; and
a fourth conductor adjacent to the second conductor, and extending in parallel with the second conductor, wherein the fourth conductor is coupled to the second port of each memory cell in the column of memory cells.

12. The circuit of claim 7, further comprising a plurality N of second capacitor coupling correction circuits coupled between the first and second conductors, wherein each of the second capacitor coupling correction circuits includes a capacitor having a capacitance selected to be approximately equal to 1/N of the parasitic capacitance.

13. The circuit of claim 12, wherein each of the second capacitor coupling correction circuits comprises:
a second inverter having an input terminal coupled to the second conductor; and
the capacitor coupled between an output terminal of the second inverter and the first conductor.

* * * * *